(12) United States Patent
Victora et al.

(10) Patent No.: US 11,120,856 B2
(45) Date of Patent: Sep. 14, 2021

(54) SPIN-ORBIT TORQUE DEVICES

(71) Applicant: Regents of the University of Minnesota, Minneapolis, MN (US)

(72) Inventors: Randall H. Victora, New Brighton, MN (US); Roy C. Bell, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 16/390,793

(22) Filed: Apr. 22, 2019

(65) Prior Publication Data
US 2019/0325931 A1 Oct. 24, 2019

Related U.S. Application Data

(60) Provisional application No. 62/661,407, filed on Apr. 23, 2018.

(51) Int. Cl.
*H01L 27/22* (2006.01)
*H01L 43/08* (2006.01)
*G11C 11/16* (2006.01)
*H01L 43/10* (2006.01)

(52) U.S. Cl.
CPC .......... *G11C 11/161* (2013.01); *H01L 27/222* (2013.01); *H01L 43/08* (2013.01); *H01L 43/10* (2013.01)

(58) Field of Classification Search
CPC .................................................... H01L 43/08
See application file for complete search history.

(56) References Cited

U.S. PATENT DOCUMENTS

| 8,134,864 B2 | 3/2012 | Victora et al. | |
| 2007/0159734 A1* | 7/2007 | Nguyen | H01L 43/10 360/324.1 |
| 2009/0080124 A1* | 3/2009 | Yoshikawa | H01L 43/08 360/324.12 |
| 2015/0035095 A1* | 2/2015 | Kim | H01L 43/08 257/421 |
| 2015/0200003 A1* | 7/2015 | Buhrman | H01L 43/08 365/158 |
| 2017/0338021 A1* | 11/2017 | Xiao | H01L 43/14 |

OTHER PUBLICATIONS

Yoshikawa et al., "Tunnel Magnetoresistance Over 100% in MgO-Based Magnetic Tunnel Junction Films With Perpendicular Magnetic L10-FePt Electrodes," IEEE Transactions on Magnetics, vol. 44, No. 11, Nov. 2008, 4 pp.

(Continued)

*Primary Examiner* — Omar F Mojaddedi
(74) *Attorney, Agent, or Firm* — Shumaker & Sieffert, P.A.

(57) ABSTRACT

An example article includes a composite free layer and a conductive channel. The composite free layer includes a high-anisotropy ferromagnetic layer, a non-magnetic transition metal layer adjacent to the high-anisotropy ferromagnetic layer, and an ultra-low damping magnetic insulator. The non-magnetic transition metal layer is between the ultra-low damping magnetic insulator and the high-anisotropy ferromagnetic layer. An example spin-orbit torque (SOT) stack may include the example article. Techniques for forming and switching example articles and SOT stacks are described.

15 Claims, 13 Drawing Sheets

(56) References Cited

OTHER PUBLICATIONS

Manchon et al., "Theory of spin torque due to spin-orbit coupling," The American Physical Society, Physical Review B, vol. 79, Mar. 30, 2009, 9 pp.
Bertram et al., "Energy Barriers in Composite Media Grains," IEEE Transactions on Magnetics, vol. 43, No. 6, Jun. 2007, 3 pp.
Khvalkovskiy et al., "Matching domain-wall configuration and spin-orbit torques for efficient domain-wall motion," The American Physical Society, Physical Review B, vol. 87, Jan. 4, 2013, 5 pp.
Stiles et al., "Anatomy of spin-transfer torque," The American Physical Society, Physical Review B, vol. 66, Jun. 24, 2002, 14 pp.
Zhang et al., "Mechanisms of Spin-Polarized Current-Driven Magnetization Switching," The American Physical Society, Physical Review Letters, vol. 88, No. 23, Jun. 10, 2002, 4 pp.
Kawahara et al., "2Mb Spin-Transfer Torque RAM (SPRAM) with Bit-by-Bit Bidirectional Current Write and Parallelizing-Direction Current Read," IEEE International Solid-State Circuits Conference, Digest of Technical Papers, Feb. 2007, 3 pp.
Zhao et al., "Failure and reliability analysis of STT-MRAM," Science Direct, Microelectronics Reliability, vol. 52, Jul. 6, 2012, 6 pp.
Kim et al., "Multilevel Spin-Orbit Torque MRAMS," IEEE Transactions on Electron Devices, vol. 62, No. 2, Feb. 2015, 9 pp.
Chen et al., "Advances and Future Prospects of Spin-Transfer Torque Random Access Memory," IEEE Transactions on Magnetics, vol. 46, No. 6, Jun. 2010, 6 pp.
Schulz, "The end of the road for silicon?," Nature, vol. 399, Macmillan Magazines Ltd., Jun. 24, 1999, 2 pp.
Kim et al., "Leakage Current: Moore's Law Meets Static Power," IEEE Computer Society, Computer, vol. 36, No. 12, Dec. 2003, 8 pp.
Bell et al., "Dual reference composite free layer design optimization for improving switching efficiency of spin-transfer torque RAM," AIP Advances, vol. 7, Feb. 24, 2017, 6 pp.
Li et al., "Spin-orbit torque-assisted switching in magnetic insulator thin films with perpendicular magnetic anistropy," Nature Communications, vol. 7, Sep. 1, 2016, 8 pp.
Weller et al., "Thermal Effect Limits in Ultrahigh-Density Magnetic Recording," IEEE Transactions on Magnetics, vol. 35, No. 6, Nov. 1999, 18 pp.
Weller et al., "High Ku Materials Approach to 100 Gbits/in2," IEEE Transactions on Magnetics, vol. 36, No. 1, Jan. 2000, 7 pp.
Pai et al., "Spin transfer torque devices utilizing the giant spin Hall effect of tungsten," Applied Physics Letters, vol. 101, Sep. 2012, 18 pp.
Rowlands et al., "Nanosecond magnetization dynamics during spin Hall switching of in-plane magnetic tunnel functions," Applied Physics Letters, vol. 110, Feb. 2017, 5 pp.
Yulaev et al., "Spin-transfer-torque reversal in perpendicular anisotropy spin valves with composite free layers," American Institute of Physics, Applied Physics Letters, vol. 99, Sep. 2011, 3 pp.
Yang et al., "Domain-wall velocities of up to 750 m s-1 driven by exchange-coupling torque in synthetic antiferromagnets," Nature Nanotechnology, vol. 10, Macmillan Publishers Ltd., Feb. 23, 2015, 6 pp.
Song et al., "Relationship between Gilbert damping and magnetocrystalline anisotropy in a Ti-buffered Co/Ni multilayer system," AIP Publishing LLC, Applied Physics Letters, vol. 103, No. 2, Jul. 2013, 5 pp.
Hauser et al., "Yttrium Iron Garnet Thin Films with Very Low Damping Obtained by Recrystallization of Amorphous Materials," Scientific Reports, vol. 6, Feb. 10, 2016.
Montazeri et al., "Magneto-optical investigation of spin-orbit torques in metallic and insulating magnetic heterostructures," Nature Communications, vol. 6, Macmillan Publishers LTD., Dec. 8, 2015, 9 pp.
Miron et al., "Perpendicular switching of a single ferromagnetic layer induced by in-plane current injection," Nature, vol. 476, Macmillan Publishers LTD., Aug. 11, 2011.
Ulrichs et al., "Optimization of Pt-based spin-Hall-effect spintronic devices," Applied Physics Letters, vol. 102, American Institute of Physics, Apr. 1, 2013, 3 pp.
Garello et al., "Symmetry and magnitude of spin-orbit torques in ferromagnetic heterostructures," Nature Nanotechnology, vol. 8, Macmillan Publishers Ltd., Jul. 28, 2013, 7 pp.
Ikeda et al., "A perpendicular-anisotropy CoFeB—MgO magnetic tunnel junction," Nature Materials, vol. 9, Jul. 11, 2010, 4 pp.
Victora et al., "Composite Media for Perpendicular Magnetic Recording," IEEE Transactions on Magnetics, vol. 41, No. 2, Feb. 2005, 6 pp.
Avci et al., "Current-induced switching in a magnetic insulator," Nature Materials, vol. 16, Macmillan Publishers LTD., Nov. 21, 2016, 7 pp.
Wang et al., "Switching of Exchange-Coupled Perpendicularly Magnetized Layers Under Spin-Orbit Torque," IEEE Transactions on Magnetics, vol. 54, No. 11, Nov. 2018, 4 pp.
Hsu et al., "Ultra Low Power Composite Free Layer Spin-Orbit Torque MRAM," Electrical and Computer Engineering, Institue of Electrical and Electronics Engineers, 2018 IEEE International Magnetic Conference, INTERMAG 2018, Oct. 24, 2018, 5 pp.
Hayakawa et al., "Current-Induced Magnetization Switching in MgO Barrier Magnetic Tunnel Junctions with CoFeB Based Synthetic Ferrimagnetic Free Layers," IEEE Transactions on Magnetics, vol. 44, No. 7, Jul. 2008, 6 pp.
Daimon et al., "Thermal imaging of spin Peltier effect," Nature Communications, vol. 7, Dec. 12, 2016, 17 pp.
Manchon, "Spin Hall effect versus Rashba torque: a Diffusive Approach," retrieved from https://arxiv.org/abs/1204.4869, Apr. 22, 2012, 7 pp.
Liu et al., "Spin-Torque Ferromagnetic Resonance Induced by the Spin Hall Effect," Physical Review Letters, No. 106, Jan. 20, 2011, 15 pp.
Allen et al., "Experimental Demonstration of the Co-existence of the Spin Hall and Rashba Effects in beta-Tantalum/Ferromagnet Bilayers," Physical Reviews B, vol. 91, Apr. 16, 2015, 18 pp.
Shiomi et al., Interface-dependent magnetotransport properties for thin Pt films on ferrimagnetic Y3Fe5O12, Applied Physics Letters, vol. 104, retrieved from https://arxiv.org/abs/1406.1859, Jun. 7, 2014, 5 pp.
Yamagishi et al., "A Novel Nonvolatile Memory with Spin Torque Transfer Magnetization Switching: Spin-RAM," IEEE International Electron Devices Meeting, IEDM Technical Digest, Dec. 2005, pp. 459-462.
Lin et al., "45nm Low Power CMOS Logic Compatible Embedded STT MRAM Utilizing a Reverse-Connection 1T/1MTJ Cell," IEEE International Electron Devices Meeting, IEDM, Dec. 2009, pp. 1-4.
Kultursay et al., "Evaluating STT-RAM as an Energy-Efficient Main Memory Alternative," 2013 IEEE International Symposium on Performance Analysis of Systems and Software (ISPASS), Apr. 2013, pp. 256-267.
Chun et al., "A Scaling Roadmap and Performance Evaluation of In-Plane and Perpendicular MTJ Based STT-MRAMs for High-Density Cache Memory," IEEE Journal of Solid-State Circuits, vol. 48, No. 2, Feb. 2013, 13 pp.
Liu et al., "RAIDR: Retention_Aware Intelligent DRAM Refresh," ISCA, vol. 40, No. 3, Jun. 2012. pp. 1-12.
Butler et al., "Spin-dependent tunneling conductance of Fe|MgO|Fe sandwiches," Physical Review B, vol. 63, Jan. 2001, 12 pp.
Bell et al., "Dual Reference Composite Free Layer Design for Improved Switching Efficiency of Spin-Transfer Torque Random Access Memory," IEEE Electron Device Letters, vol. 37, No. 9, Sep. 2016, 4 pp.
Schafers et al., "Electric breakdown in ultrathin MgO tunnel barrier junctions for spin-transfer torque switching," Applied Physics Letters, vol. 95, Dec. 11, 2009, 4 pp.
Zhao et al., "Low writing energy and sub nanosecond spin torque transfer switching of in-plane magnetic tunnel function for spin torque transfer random access memory," Journal of Applied Physics, vol. 109, Mar. 29, 2011, 4 pp.
Manipatruni et al., "Energy-delay performance of giant spin Hall effect switching for dense magnetic memory," The Japan Society of Applied Physics, Applied Physics Express, vol. 7, Sep. 19, 2014, 5 pp.

(56) References Cited

OTHER PUBLICATIONS

Qu et al., "Effect of substitutional defects on Kambersky damping in L1 magnetic materials," Applied Physics Letters, vol. 106, Feb. 18, 2015, 6 pp.

Iihama et al., "Observation of Precessional Magnetization Dynamics in L1-FePt Thin Films with Different L1 Order Parameter Values," The Japan Society of Applied Physics, Japanese Journal of Applied Physics, vol. 52, Jun. 18, 2013, 5 pp.

Charap et al., "Thermal Stability of Recorded Information at High Densities," IEEE Transactions on Magnetics, vol. 33, No. 1, Jan. 1997, 6 pp.

Zeng et al., "Exchange-coupled nanocomposite magnets by nanoparticle self-assembly," Nature Publishing Group, Nature, vol. 420, Issue 6914, Nov. 28, 2002, pp. 395-398.

Meng et al., "Composite free layer for high density magnetic random access memory with lower spin transfer current," Applied Physics Letters, vol. 89, Oct. 12, 2006, 4 pp.

Zoll et al., "Preserved interfacial magnetism and giant antiferromagnetic exchange coupling in Co/Rh sandwiches," IOP Institute of Phsyics, A Letters Journal Exploring the Frontiers of Physics, EPL, Europhysics Letters, vol. 39, Issue 3, Aug. 1, 1997, pp. 323-328.

Grunberg, Layered Magnetic Structures in Research and Application, Acta Materlia, vol. 48, Jul. 15, 1999, 13 pp.

Yamada et al., "Reducing the switching current with a Gilbert damping constant in nanomagnetics with perpendicular anisotropy," Applied Physics Letters, vol. 106, Jan. 28, 2015, 6 pp.

Chang et al., "Nanometer-Thick Yttrium Iron Garnet Films With Extremely Low Damping," IEEE Magnetics Letters, vol. 5, accepted Aug. 6, 2014, current version Sep. 17, 2014, 4 pp.

Wang et al., "Strain-tunable magnetocrystalline anistropy in epitaxial Y3FE5O123 thin films," American Physical Society, Physical Review B, vol. 89, Apr. 2014, 5 pp.

Hahn et al., "Comparative measurements of inverse spin Hall effects and magnetoresistance in YIG/Pt and YIG/Ta," American Physical Society, Physical Review B, vol. 87, May 13, 2013, 8 pp.

Wang et al., "Large spin pumping from epitaxial Y3FE5O12 thin films to Pt and W layers," American Physical Society, Physical Review B, vol. 88, Sep. 18, 2013, 5 pp.

* cited by examiner

SPIN-ORBIT TORQUE DEVICES

This application claims the benefit of priority to U.S. Provisional Patent Application No. 62/661,407, titled, "SPIN-ORBIT TORQUE DEVICES," filed Apr. 23, 2018, the entire content of which is incorporated herein by reference.

GOVERNMENT CLAUSE

This invention was made with government support under Grant No. HR0011-13-3-0002 awarded by the Department of Defense/Defense Advanced Research Projects Agency (DARPA). The government has certain rights in the invention.

TECHNICAL FIELD

The present disclosure relates to spin-orbit torque devices.

BACKGROUND

Spin-transfer torque RAM (STTRAM) is a non-volatile, zero static power alternative to Silicon-based memories. STTRAM is a candidate for next generation memory as complementary metal-oxide-semiconductor (CMOS) technology begins to hit physical limits, including high leakage currents, heating issues, and the like that beget intractable refresh rates as dynamic random-access memory (DRAM) scales to higher densities. However, STTRAM comes with its own design challenges.

SUMMARY

In general, the present disclosure is directed to spin-orbit torque (SOT) devices, and techniques for making and switching SOT devices or articles including SOT structures.

In some examples, the disclosure describes an article including a composite free layer. The composite free layer includes a high-anisotropy ferromagnetic layer, a non-magnetic transition metal layer adjacent to the high-anisotropy ferromagnetic layer, and an ultra-low damping magnetic insulator. The non-magnetic transition metal layer is between the ultra-low damping magnetic insulator and the high-anisotropy ferromagnetic layer. The example article includes a conductive channel including a heavy metal region adjacent the composite free layer. The ultra-low damping magnetic insulator is between the non-magnetic transition metal layer and the conductive channel.

In some examples, the disclosure describes an example technique including depositing a non-magnetic transition metal layer on an ultra-low damping magnetic insulator. The ultra-low damping magnetic insulator is on a conductive channel comprising a heavy metal region. The example technique includes depositing a high-anisotropy ferromagnetic layer on the non-magnetic transition metal layer.

In some examples, the disclosure describes an example technique including inducing spin orbit torque by passing a current through a heavy metal region of a conductive channel adjacent a composite free layer. The composite free layer includes a high-anisotropy ferromagnetic layer, a non-magnetic transition metal layer adjacent to the high-anisotropy ferromagnetic layer, and an ultra-low damping magnetic insulator. The example technique includes switching a magnetization of the ultra-low damping magnetic insulator in response to the spin orbit torque. The example technique includes switching a perpendicular magnetization in the high-anisotropy ferromagnetic layer in response to the switching of the magnetization of the ultra-low damping magnetic insulator. The high-anisotropy ferromagnetic layer is exchange-coupled to the ultra-low damping magnetic insulator.

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

Figure 1A:
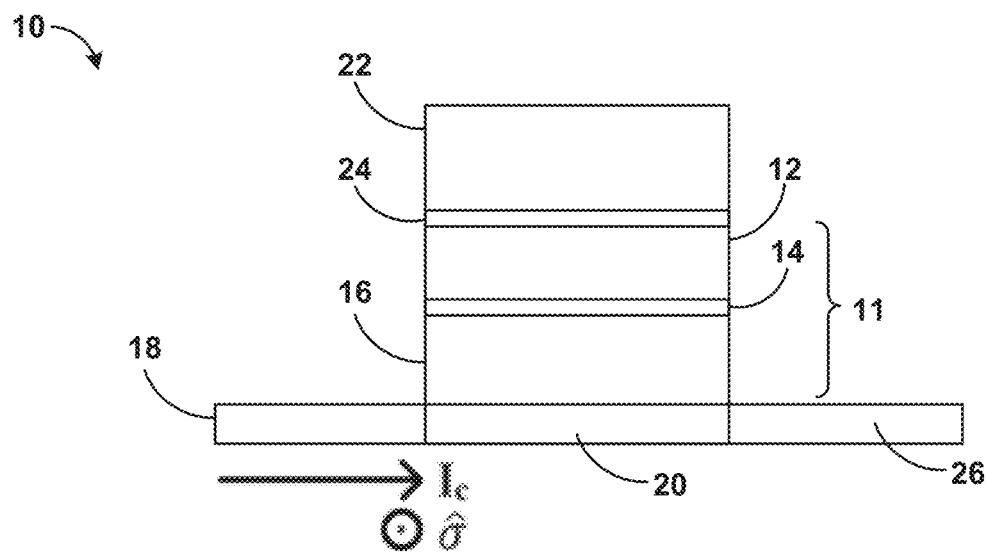
FIG. 1A is a conceptual diagram illustrating a side view of an example article including a composite free layer including a high-anisotropy ferromagnetic layer, a non-magnetic transition metal layer and an ultra-low damping magnetic insulator.

In some examples, the disclosure describes spin-orbit torque (SOT) devices, and techniques for making and switching SOT devices or articles including SOT structures. An example SOT device may include a memory structure, for example, a SOT random-access memory (SOTRAM) cell. In some examples, articles according to the disclosure may be used in ultra-high density-memory incorporating highly-efficient (for example, low power consuming), exchange-coupled SOTRAM cells. In some examples, the power consumption of some SOT devices described herein may be of factor of about 70 or so below a power consumption associated with DRAM.

In some examples, the disclosure describes an article including a composite free layer. The composite free layer includes a high-anisotropy ferromagnetic layer, a non-magnetic transition metal layer adjacent to the high-anisotropy ferromagnetic layer, and an ultra-low damping magnetic insulator. The non-magnetic transition metal layer is between the ultra-low damping magnetic insulator and the high-anisotropy ferromagnetic layer. The example article includes a conductive channel including a heavy metal region adjacent the composite free layer. The ultra-low damping magnetic insulator is between the non-magnetic transition metal layer and the conductive channel.

In some examples, the disclosure describes a technique including depositing a non-magnetic transition metal layer on an ultra-low damping magnetic insulator. The ultra-low damping magnetic insulator is on a conductive channel comprising a heavy metal region. The example technique includes depositing a high-anisotropy ferromagnetic layer on the non-magnetic transition metal layer.

In some examples, the disclosure describes a technique including inducing spin orbit torque by passing a current through a heavy metal region of a conductive channel adjacent a composite free layer. The composite free layer includes a high-anisotropy ferromagnetic layer, a non-magnetic transition metal layer adjacent to the high-anisotropy ferromagnetic layer, and an ultra-low damping magnetic insulator. The example technique includes switching a magnetization of the ultra-low damping magnetic insulator in response to the spin orbit torque. The example technique includes switching a perpendicular magnetization in the high-anisotropy ferromagnetic layer in response to the switching of the magnetization of the ultra-low damping magnetic insulator. The high-anisotropy ferromagnetic layer is exchange-coupled to the ultra-low damping magnetic insulator.

By exploiting typically unrealized benefits of spin-orbit torque (SOT), in particular, its compatibility with low-damping insulators and the energy efficiencies associated with exchange coupling of magnetically hard and soft composite structures, a write energy of 10 aJ/bit may be achieved for a 10 nm cell. Furthermore, high magnetocrystalline anisotropy ($K_u$) materials such as $L1_0$-FePt may be employed not only to facilitate achievement of ultra-high-density memory but to allow for reduction of heavy metal layer volume and a reduction in write energy not seen in previous CoFeB-based cells. In some examples, this energy may be within a factor 40 of the theoretical limit of 60 $k_BT$, and may also represents a $10^3$ improvement in energy consumption compared to state-of-the-art double data rate fourth-generation (DDR4) DRAM cells and a $10^5$ improvement in energy consumption when DRAM refresh energies are included.

In contrast with SOTRAM, STTRAM may suffer from rapid tunnel barrier degradation and an inefficient use of electron spin—both due to its current-perpendicular-to-plane (CPP) geometry. Furthermore, the insulating barrier resistivity substantially increases write energy. The barrier breakdown field generally limits switching to 1 GHz for thermally stable devices.

Spin-orbit torque RAM (SOTRAM) devices utilize spin-orbit interaction at the interface of heavy metal (HM) and ferromagnetic (FM) layers via mechanisms such as the Rashba effect and spin hall effect (SHE). This method of generating torque may be more efficient than STTRAM since the electrons travel parallel (instead of perpendicular) to the interface, enabling each electron to undergo multiple spin-flip scatterings and exceeding a single quanta of spin ($\hbar/2$). This inefficiency in STTRAM requires larger critical current, which flows through the tunnel barrier and accelerates its deterioration. The current-in-plane (CIP) geometry of SOTRAM allows the use of low-damping magnetic insulators (MI) in place of the FM, reducing critical current further. This benefit may be leveraged in the construction of example SOTRAM cells. Compared to STTRAM, the impedance is determined by the HM and is much lower than that of MgO. Therefore, SOT-based articles and systems may be inherently low-impedance and can operate at several mV.

Figure 1B:
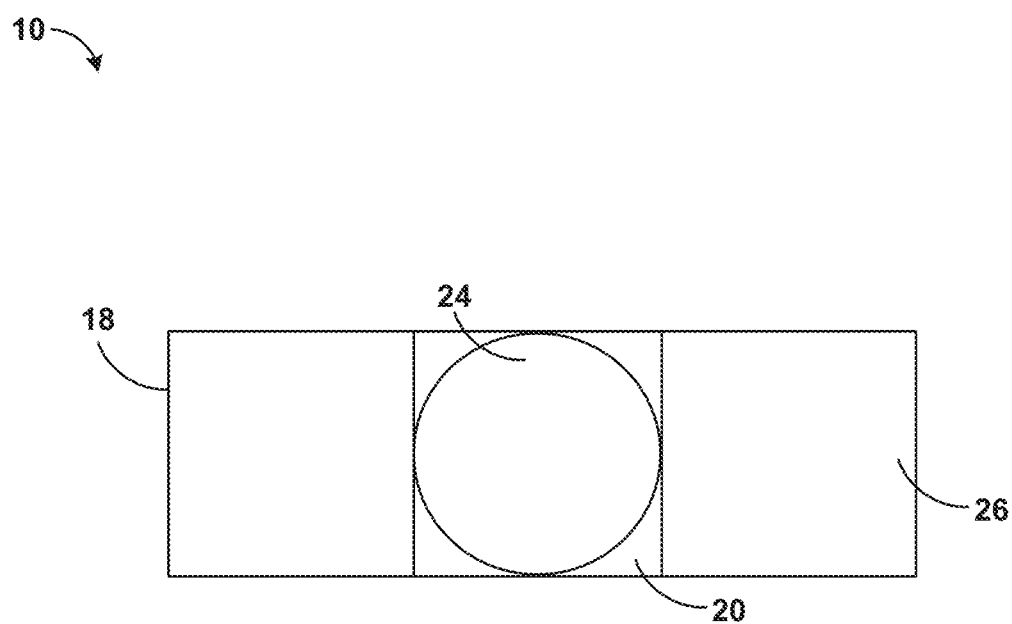
FIG. 1B is a conceptual diagram illustrating a top view of the article of FIG. 1A.

FIG. 1A is a conceptual diagram illustrating a side view of an example article 10 including a composite free layer 11 including a high-anisotropy ferromagnetic layer 12, a non-magnetic transition metal layer 14, and an ultra-low damping magnetic insulator 16. FIG. 1B is a conceptual diagram illustrating a top view of article 10 of FIG. 1A. One or more layers of composite free layer 11 have switchable free magnetic fields.

Ultra-low damping magnetic insulator 16 (also referred to as "ULD") may be a relatively easily switchable soft magnetic layer, and switching of ultra-low damping magnetic insulator 16 may promote or cause switching of high-anisotropy ferromagnetic layer 12 (also referred to as "FM"), for example, via magnetic coupling modulated by non-magnetic transition metal layer 14. In some examples, ultra-low damping magnetic insulator 16 may be antiferromagnetically coupled to high-anisotropy ferromagnetic layer 12. Thus, high-anisotropy ferromagnetic layer 12 and ultra-low damping magnetic insulator 16 may constitute a synthetic antiferromagnet that is substantially stray-field free.

In some examples, article 10 may include an ultra-high density memory cell. Article 10 may include an FM material with relatively high magnetocrystalline anisotropy $K_u$ (for example, on the order of 10-100 Merg/cc) to promote high thermal stability ($\Delta$). For example, $L1_0$-ordered FePt may be employed due to its high magnetocrystalline anisotropy ($K_{FePt}$=70 Merg/cc) and moderate Gilbert damping ($\alpha_{Fept}$=0.02). As another example, $L1_0$ FePd may be employed. Generally, a thermal stability of 40-60 $k_BT$ achieves data retention on the order of 5-10 years, where $k_B$ is the Boltzmann constant and T is the absolute room temperature. A high $K_u$ material like FePt or FePd may reduce the requisite device diameter and, thus, the cross-sectional area of the HM layer, which may in turn reduce switching current and write energy.

For example, high-anisotropy ferromagnetic layer 12 may include a magnetic material such as $L1_0$ FePt or $L1_0$ FePd. In some examples, high-anisotropy ferromagnetic layer 12 includes $L1_0$ FePt. In some examples, high-anisotropy ferromagnetic layer 12 consists of or consists essentially of $L1_0$ FePt. In some examples, high-anisotropy ferromagnetic layer 12 includes $L1_0$ FePd. In some examples, high-anisotropy ferromagnetic layer 12 consists of or consists essentially of $L1_0$ FePd. High-anisotropy ferromagnetic layer 12 may have a magnetic anisotropy in a range from about $1\times10^6$ ergs/cc to about $4\times10^7$ ergs/cc, such as a magnetic anisotropy in a range from about $1\times10^6$ ergs/cc to $2.5\times10^7$ ergs/cc.

High-anisotropy ferromagnetic layer 12 may have any suitable thickness, measured in a direction normal to a major surface defined by article 10 or conductive channel 18. For example, high-anisotropy ferromagnetic layer 12 may have a thickness in a range from about 3 Angstroms (Å) to about 10 nanometers (nm), such as a thickness in a range from about 3 Å to about 5 nm. In some examples, it may be difficult to uniformly deposit high-anisotropy ferromagnetic layer 12 layer with a thickness of less than 3 Å. In some examples, it may be difficult to deposit high-anisotropy ferromagnetic layer 12 layer with a thickness of greater than about 5 nm, or greater than about 10 nm, for example, using techniques such as lithography.

Non-magnetic transition metal layer 14 is between high-anisotropy ferromagnetic layer 12 and ultra-low damping magnetic insulator 16 and may promote exchange coupling of high-anisotropy ferromagnetic layer 12 and ultra-low damping magnetic insulator 16, for example, by modulating antiferromagnetic coupling. Non-magnetic transition metal layer 14 includes at least one non-magnetic transition metal. For example, non-magnetic transition metal layer 14 may include a metal or alloy including at least one non-magnetic metal belonging to groups 3d, 4d, or 5d of the elemental periodic table. In some examples, non-magnetic transition metal layer includes rhodium (Rh). In some examples, non-magnetic transition metal layer essentially consists of rhodium. Using rhodium may provide, in some examples, peak exchange coupling ($J_{ex}$) values of 34 erg/cm$^2$.

Non-magnetic transition metal layer 14 may define any suitable thickness. In some examples, non-magnetic transition metal layer 14 has a thickness of less than about 15 Å. In some examples, a thickness of less than 15 Å may promote antiferromagnetic exchange coupling, and a thickness of greater than 15 Å may weaken antiferromagnetic exchange coupling. In some examples, non-magnetic transition metal layer 14 has a thickness of more than about 1 Å, or more than about 3 Å, or more than about 5 Å, and/or less than about 15 Å, or less than about 10 Å.

Article 10 also includes a conductive channel 18 including a heavy metal region 20 adjacent composite free layer 11. Ultra-low damping magnetic insulator 16 may be between non-magnetic transition metal layer 14 and conductive channel 18, as shown in FIG. 1A. Ultra-low damping magnetic insulator 16 may include any suitable magnetically insulating material that is ultra-low damping, for example, having a damping constant α on the order of $10^{-5}$. Ultra-low damping associated with α on the order of $10^{-5}$ or lower may reduce the energy required to switch magnetization of composite free layer 11 or a layer of composite free layer 11. In some examples, ultra-low damping magnetic insulator 16 includes yttrium iron garnet (YIG) or barium ferrite.

Example SOTRAM structures may have a current-in-plane (CIP) geometry, and as a consequence, current may not flow through YIG. Thus, YIG may be used as an ultra-low damped soft layer, i.e., ultra-low damping magnetic insulator 16. The magnetocrystalline anisotropy of YIG ($K_{YIG}$) is ~10 kerg/cc. In some examples, ultra-low damping magnetic insulator 16 includes YIG having a damping constant $\alpha_{YIG}$, of about $5\times10^{-5}$). In some examples, ultra-low damping magnetic insulator 16 consists of or consists essentially of YIG. Ultra-low damping magnetic insulator 16 may define any suitable thickness. For example, ultra-low damping magnetic insulator 16 may define a thickness of at least about 10 nm, and less than about 1 μm, or less than about 0.1 μm (100 nm).

Conductive channel 18 may include a conductive region 26 adjacent or surrounding heavy metal region 20. Conductive region 26 may include any suitable conducting material, for example, an electrically conductive metal or an alloy. In some examples, conductive region 26 includes copper (Cu) or aluminum (Al). In some examples, conductive region 26 consists essentially of Cu.

Heavy metal region 20 (also known as "HM") of conductive channel may include any suitable heavy metal. For example, heavy metal region 20 may include one or more of a metal or an alloy including platinum, palladium, or tungsten. In some examples, heavy metal region 20 includes β-tungsten. In some examples, heavy metal region 20 consists of or consists essentially of β-tungsten. β-tungsten may provide a relatively high SOT capability, for example, by having a relatively higher resistivity, while also scattering electrons. The thickness of heavy metal region 20 may be substantially the same as a thickness of conductive channel 18, in a direction normal to a major surface defined by conductive channel 18. In some examples, heavy metal region 20 may have a thickness different from a thickness of conductive channel 18.

Composite free layer 11 and conductive channel 18 may be part of an SOT cell, or an SOT structure, for example, an SOT memory cell. Thus, in some examples, article 10 may include an SOT RAM cell. In some examples, article 10 may include additional layers adjacent composite free layer 11 to "read" or "write" a memory bit from or to article 10, for example, by detecting a magnetic state, or by switching a magnetic state of article 10, or of composite free layer 11, or of a layer of composite free layer 11. In some examples, article 10 further includes a reference layer 22 and a barrier layer 24 adjacent composite free layer 11 and opposing conductive channel 18. For example, reference layer 22 and barrier layer 24 may be adjacent high-anisotropy ferromagnetic layer 12, with high-anisotropy ferromagnetic layer 12 between barrier layer 24 and the non-magnetic transition metal layer 14, and barrier layer 24 between high-anisotropy ferromagnetic layer 12 and reference layer 22. In some examples, barrier layer 24 includes MgO. In some examples, barrier layer 24 consists of or consists essentially of MgO.

Reference layer 22 may include any suitable material having a relatively fixed magnetization, for example, a fixed perpendicular magnetization. In some examples, reference layer 22 and composite layer 11 (for example, layers of composite layer 11) are both perpendicularly magnetized. An $L1_0$-FePt/MgO/$L1_0$-FePt MTJ and exchange-coupled CoFeB/MgO/CoFeB/Ru/CoFeB MTJ demonstrate TMR of 100%. In some examples, reference layer 22 may include $L1_0$-FePt with barrier layer 24 including MgO for sufficient readability. Read-out may be accomplished with a small read current flowing between reference layer 22 and another layer of composite free layer 11.

In some examples, article 10 may include respective interconnects between current or voltage sources and one or more layers of article 10, for example, layers of composite free layer 11 or other layers of article 11, for reading and writing. In some examples, article 10 may include at least one of read or write circuitry to cause a memory value (for example, a bit) to be written to or read from article 10. The memory value may be represented by a magnetization of composite free layer 11. For example, a first magnetic orientation of composite free layer 11 or of a layer of composite free layer 11 may denote a binary '1', and a second magnetic orientation of composite free layer 1 or of a layer of composite free layer 11 may denote a binary '0'. In some examples, an example system, for example, a SOTRAM chip, may include an array of articles similar to article 10.

In some examples, an example spin-orbit-torque (SOT) stack may include article 10 or any example article according to the disclosure.

Figure 2:
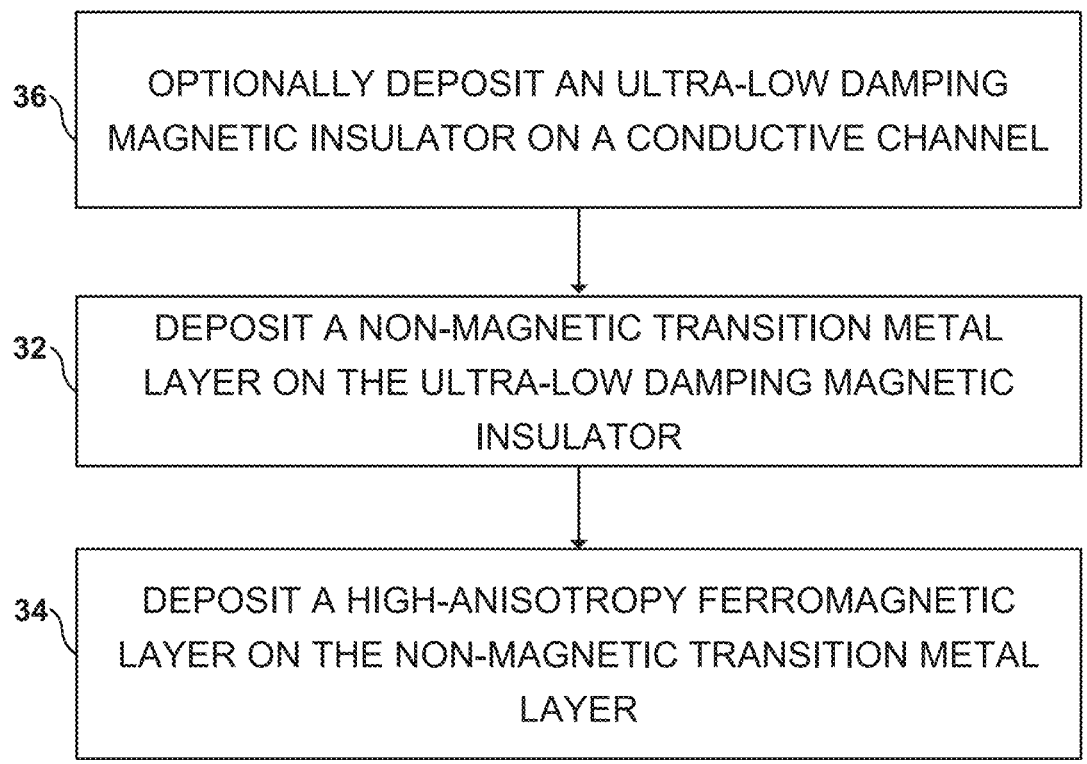
FIG. 2 is a flow diagram illustrating an example technique for forming an example article including a composite free layer.

FIG. 2 is a flow diagram illustrating an example technique for forming an example article including a composite free layer. While the example technique of FIG. 2 is described with reference to article 10 of FIGS. 1A and 1B, example techniques according to the disclosure may be used to form any example articles according to the disclosure.

In some examples, the technique of FIG. 2 includes depositing non-magnetic transition metal layer 14 on ultra-low damping magnetic insulator 16 (32). Any suitable technique, such as chemical vapor deposition, physical vapor deposition, plasma deposition, or any suitable technique may be used for the depositing (32). In some examples, the depositing (32) of non-magnetic transition metal layer 14 may include sputtering a non-magnetic transition metal composition on ultra-low damping magnetic insulator 16. The non-magnetic transition metal composition may include a metal or alloy described with reference to non-magnetic transition metal layer 14 of FIG. 1A.

In some examples, the technique of FIG. 2 includes depositing high-anisotropy ferromagnetic layer 12 on non-magnetic transition metal layer (34). Any suitable technique, such as chemical vapor deposition, physical vapor deposition, plasma deposition, or any suitable technique may be used for the depositing (34). In some examples, the depositing (34) of high-anisotropy ferromagnetic layer 12 may include sputtering a high-anisotropy ferromagnetic composition on non-magnetic transition metal layer 14. The high-anisotropy ferromagnetic composition may include any suitable metal or alloy described with reference to high-anisotropy ferromagnetic layer 12 of FIG. 1A.

In some examples, the technique of FIG. 2 optionally includes, before the deposition (32) of non-magnetic transition metal layer 14, depositing ultra-low damping magnetic insulator 16 on conductive channel 18 an yttrium iron garnet (YIG) composition on conductive channel 18 (36) using pulse laser deposition. The depositing (36) may include growing layers of ferrimagnetic thulium iron garnet (TmIG) on gadolinium gallium garnet (GGG), for example, (111)-oriented GGG by pulse laser deposition.

Figure 3:
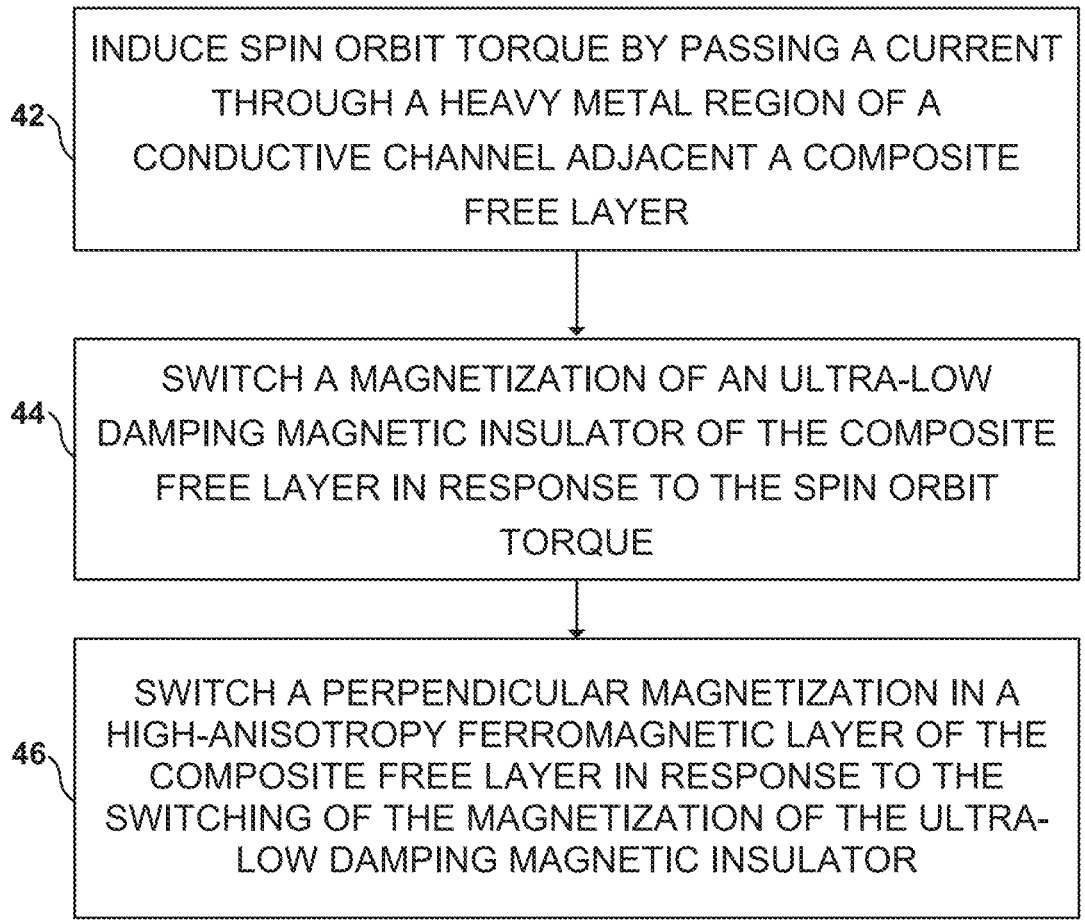
FIG. 3 is a flow diagram illustrating an example technique for switching an example article including a composite free layer.

FIG. 3 is a flow diagram illustrating an example technique for switching article 10 including composite free layer 11. While the example technique of FIG. 3 is described with reference to article 10 of FIG. 1, example techniques according to the disclosure may be used to switch any example articles according to the disclosure.

The example technique of FIG. 3 may include inducing spin orbit torque by passing a current through heavy metal region 20 of conductive channel 18 adjacent composite free layer 11 (42). The example technique may include switching a magnetization of ultra-low damping magnetic insulator 16 in response to the spin orbit torque (44). The example technique may include switching a perpendicular magnetization in high-anisotropy ferromagnetic layer 12 in response to the switching of the magnetization of ultra-low damping magnetic insulator 16 (46). The switching may be promoted by exchange coupling. For example, the switching may progress by domain wall switching, or a compound mechanism. In some examples, magnetic layers within high-anisotropy ferromagnetic layer 12 adjacent ultra-low damping magnetic insulator 16 may switch first, and promote the switching of an adjacent layer, ultimately resulting in successive switching of all layers high-anisotropy ferromagnetic layer 12 in a direction away from ultra-low damping magnetic insulator 16. Thus, ultimately, magnetization of high-anisotropy ferromagnetic layer 12 may be switched by changing a current or reversing a current in conductive channel 18.

Article 10 may be switched when a critical charge current density ($J_c$) passes through heavy metal region 20, inducing spin accumulation at the HM/FM interface (for example, an interface between composite free layer 11 and heavy metal region 20) due to spin-orbit interaction via a spin-Hall effect. Spin accumulation density ($J_s$) is given by EQUATION 1.

$$J_s = \Phi_H\left(1 - \mathrm{sech}\left(\frac{t_H}{\lambda_H}\right)\right)\frac{J_c}{|e|} \quad \text{(Equation 1)}$$

where $\Phi_H$, $t_H$, $\lambda_H$, and e are the spin hall angle, HM thickness ("HM" denotes heavy metal region 20), HM spin-flip scattering length, and electron charge, respectively. The spin hall angle describes the maximum efficiency of the HM to convert charge current density into spin accumulation density. The thickness dependence of this conversion captures the spin backscattering from the bottom surface of the HM.

A spin-orbit torque is generated in the transverse direction (denoted by 6 in FIG. 1A) and reverses the magnetization of the easily-switched ultra-low damping magnetic insulator 16. This generates an exchange field from ultra-low damping magnetic insulator 16 that switches high-anisotropy ferromagnetic layer 12. In some examples, the anisotropy axes of ultra-low damping magnetic insulator 16 and high-anisotropy ferromagnetic layer 12 point in the $\hat{\sigma}$ direction, which may attenuate the spin backflow, for example, via a FeMn spin sink underlayer.

For a desired thermal stability (A), the write energy density may be given by EQUATION 2:

$$E_W = t_p R_H I_c^2 = t_p \rho_H l d t_H \left(\frac{|e|J_s}{\Phi_H\left(1 - \mathrm{sech}\left(\frac{t_H}{\lambda_H}\right)\right)}\right)^2 \quad \text{(Equation 2)}$$

where $t_p$, $I_c$, $R_H$, $\rho_H$, l, and d are the current pulse duration, critical charge current, HM electrical resistance, HM resistivity, and HM length, respectively. The generalized preferable HM thickness ($t_{H,opt}$) is obtained via the first and second derivative tests: $t_{H,opt} = 2.45\lambda_H$. EQUATION 2 transforms to EQUATION 3:

$$E_W \cong 3.57 t_p \rho_H d^2 \lambda_H \left(\frac{|e|J_s}{\Phi_H}\right)^2 \quad \text{(Equation 3)}$$

where l≅d (similar length and diameter). From EQUATION 3, a figure of merit (FOM) for HM layer selection is given by EQUATION 4:

$$FOM_H = \frac{\Phi_H^2}{\rho_H \lambda_H} \quad \text{(Equation 4)}$$

where the best heavy metals have the largest $FOM_H$. A large spin hall angle results in smaller charge current density. Small resistivity reduces bias voltage. Small spin-flip scattering length reduces thickness. This linearly increases resistance but decreases charge current, which affects $E_W$ quadratically. This figure of merit may be used to select suitable HM materials for heavy metal region 20.

The desired Δ is calculated from the sum of the anisotropy energy, the demagnetization energy, and exchange energy of the entire structure. Magnetostatic interaction is neglected owing to the stray-field free nature of this cell and the large exchange coupling between, for example, ultra-low damping magnetic insulator 16 (for example, YIG) and high-anisotropy ferromagnetic layer 12 (for example) FePt. Δ may be obtained by EQUATION 5.

$$\Delta = \tfrac{1}{4}\pi d^2 (t_{ULD} K_{ULD} + t_{FM} K_{FM}) \cong \tfrac{1}{4}\pi d^2 t_{FM} K_{FM} \quad \text{(Equation 5)}$$

where $t_{ULD}$ and $t_{FM}$ are the thicknesses of ultra-low damping magnetic insulator 16 and high-anisotropy ferromagnetic layer 12, respectively. This agrees with previous Δ calculations for composite structures. The ULD contribution is negligible, because $K_{ULD} \cong 10^{-4} K_{FM}$. A thermal stability $\Delta = 60 k_B T$ ensures a data retention of 10 years. EQUATION 3 may be rewritten as EQUATION 6:

$$E_W \cong \frac{272.55\, t_p k_B T \rho_H \lambda_H}{t_{FM} K_{FM}} \left(\frac{|e| J_s}{\Phi_H}\right)^2 \quad \text{(Equation 6)}$$

The critical spin accumulation density ($J_s$) is calculated via the 4$^{th}$ Order Runge-Kutta numerical integration of the set of coupled Landau-Lifshitz equations with the SOT term described in EQUATIONS 7 and 8:

$$\frac{d\hat{m}_{ULD}}{dt} = -\gamma \hat{m}_{ULD} \times \vec{H}_{ULD} - \gamma \alpha_{ULD} \hat{m}_{ULD} \times (\hat{m}_{ULD} \times \vec{H}_{ULD}) + \vec{\tau}_{she} \quad \text{(Equation 7)}$$

$$\frac{d\hat{m}_{FM}}{dt} = -\gamma \hat{m}_{FM} \times \vec{H}_{FM} - \gamma \alpha_{FM} \hat{m}_{FM} \times (\hat{m}_{FM} \times \vec{H}_{FM}) \quad \text{(Equation 8)}$$

where $\hat{m}_{ULD}$, $\vec{H}_{FM}$, $\hat{m}_{FM}$, $\vec{H}_{FM}$, $\gamma$, and $\vec{\tau}_{she}$ are the unit magnetization vector of ultra-low damping magnetic insulator 16, the effective field on ultra-low damping magnetic insulator 16, unit magnetization vector of high-anisotropy ferromagnetic layer 12, effective field on high-anisotropy ferromagnetic layer 12, gyromagnetic ratio, and the SHE torque, respectively. The damping term of EQUATION 7 is negligible since $\alpha_{ULD} \cong 10^{-5}$. The effective field imposed on ultra-low damping magnetic insulator 16 is approximately equal to the exchange field imposed on it by high-anisotropy ferromagnetic layer 12, since its coercivity and saturation magnetization ($M_{s,ULD} = 75$ emu/cc) are relatively very small, as given by EQUATION 9:

$$\vec{H}_{ULD} \cong \frac{J_{ex}}{t_{ULD} M_{s,ULD}} \hat{m}_{ULD} \quad \text{(Equation 9)}$$

The effective field of high-anisotropy ferromagnetic layer 12 is expressed by EQUATION 10:

$$\vec{H}_{FM} = \frac{J_{ex}}{t_{FM} M_{s,FM}} \hat{m}_{ULD} - \vec{N}_{dm} M_{s,FM} \hat{m}_{FM} + \frac{2 K_{FM}}{M_{s,FM}} \hat{m}_{FM,z} \quad \text{(Equation 10)}$$

where $M_{s,FM}$, $\vec{N}_{dm}$, and $\hat{m}_{FM,z}$, are the saturation magnetization of high-anisotropy ferromagnetic layer 12 (1140 emu/cc for FePt), demagnetization tensor for high-anisotropy ferromagnetic layer 12, and z-component of the unit magnetization vector for high-anisotropy ferromagnetic layer 12, respectively.

The SOT is given by EQUATION 11:

$$\vec{\tau}_{she} = -\gamma \frac{\hbar J_s}{2 M_{s,ULD} t_{ULD}} [\hat{m}_{ULD} \times (\hat{\sigma} \times \hat{m}_{ULD}) + r_{\perp/\parallel} (\hat{\sigma} \times \hat{m}_{ULD})] \quad \text{(Equation 11)}$$

where $\hbar$ is the reduced Planck constant and $r_{\perp/\parallel}$ is the ratio of the out-of-plane field-like torque to the in-plane Slonczewski-like torque. This value is approximately 1.0 for a HM layer (for example, heavy metal region 20) with $t_H > \lambda_H$ and adjacent FM layer (e.g., YIG) with $t_{ULD} \cong \lambda_{\phi ULD}$, where $\lambda_{\phi ULD}$ is the spin dephasing length of ultra-low damping magnetic insulator 16 ($\lambda_{\phi ULD} \cong 30$ nm). The field-like term is typically neglected in spin-valves with dephasing lengths much smaller than their thickness, but the dephasing length of ultra-low damping magnetic insulator 16 may be on the order of its thickness in some examples.

Thus, in some examples, the write field for composite free layer 11 may scale proportionally to a thickness of high-anisotropy ferromagnetic layer 12 ($t_{FM}$). Similarly, an increase in $t_{FM}$ yields a proportional $J_s$. Therefore, $J_s \propto t_{FM} \propto d^{-2}$ and $E_w \propto d^{-2}$. The scaling may be a function of the thicknesses of ultra-low damping magnetic insulator 16, non-magnetic transition metal layer 14, and high-anisotropy ferromagnetic layer 12 ($t_{Rh}$ may determines $J_{ex}$).

EXAMPLES

Example 1

Composite structures having diameters of 13.2 nm, 9.4 nm, and 6.6 nm were simulated. The initial angle was estimated from thermal stability by: $\theta_0 = \sqrt{1/\Delta} \cong 0.13$ rad. Similarly, the critical angle for magnetization switching is $\theta_0 = \pi - \theta_0$ and is defined as the angular distance the magnetization must travel to constitute a thermally stable reversal. Both free layers must travel $\theta_c$ within 1 ns for ultrafast information storage. The numerical integration time step is 10 fs. The spin-hall angle is set to 0.3—achievable with β-W (β-tungsten) thin films, which have $\rho_H = 200$ μΩcm and $\lambda_H = 1.4$ nm. Therefore, $FOM_H$ of β-W is 31.1 kΩnm$^2$.

Figure 4A:
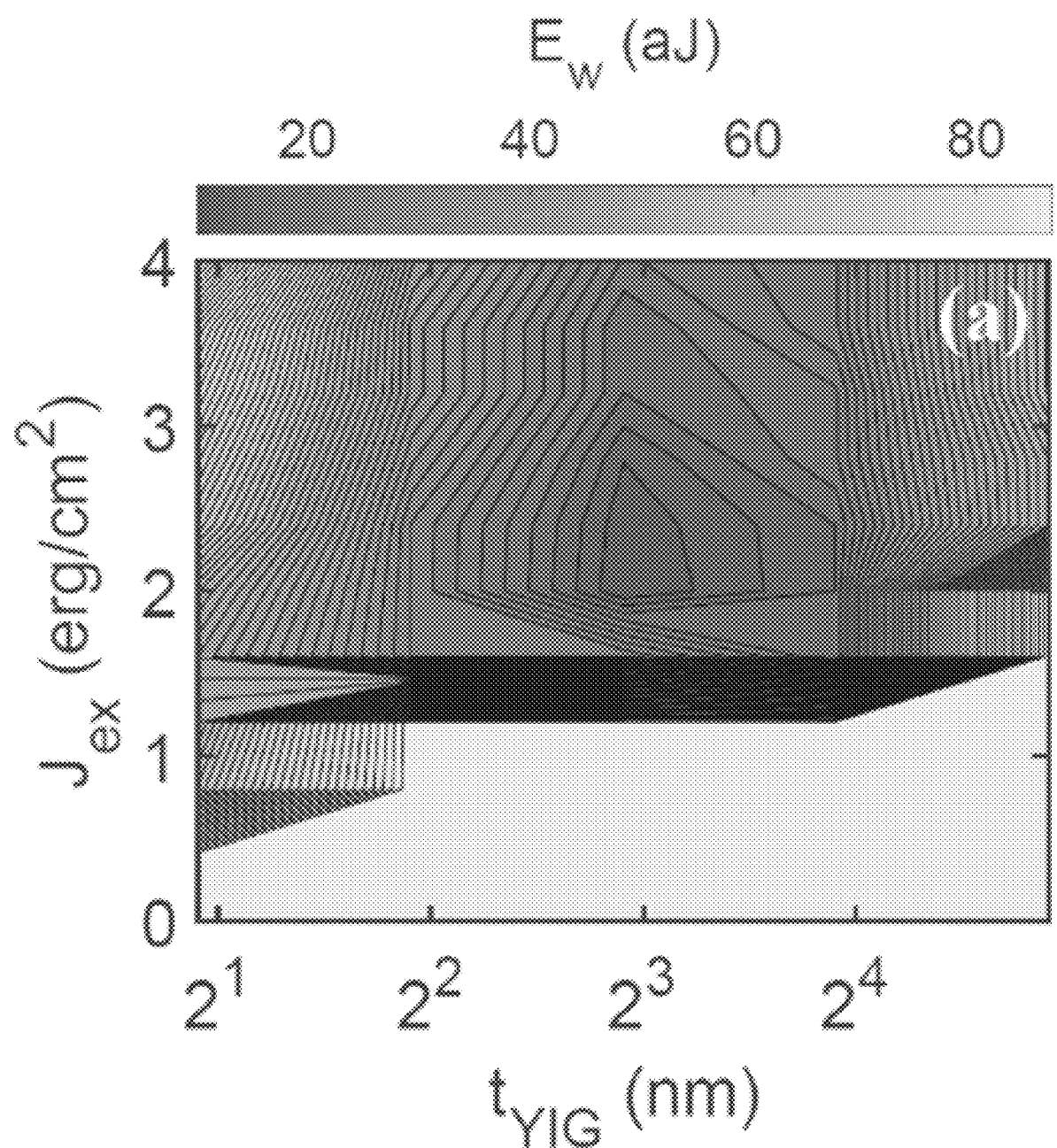
FIG. 4A is a chart illustrating relationships between write energy, exchange coupling, and magnetic insulator thickness for an example device having a diameter of 13.2 nm.
Figure 4B:
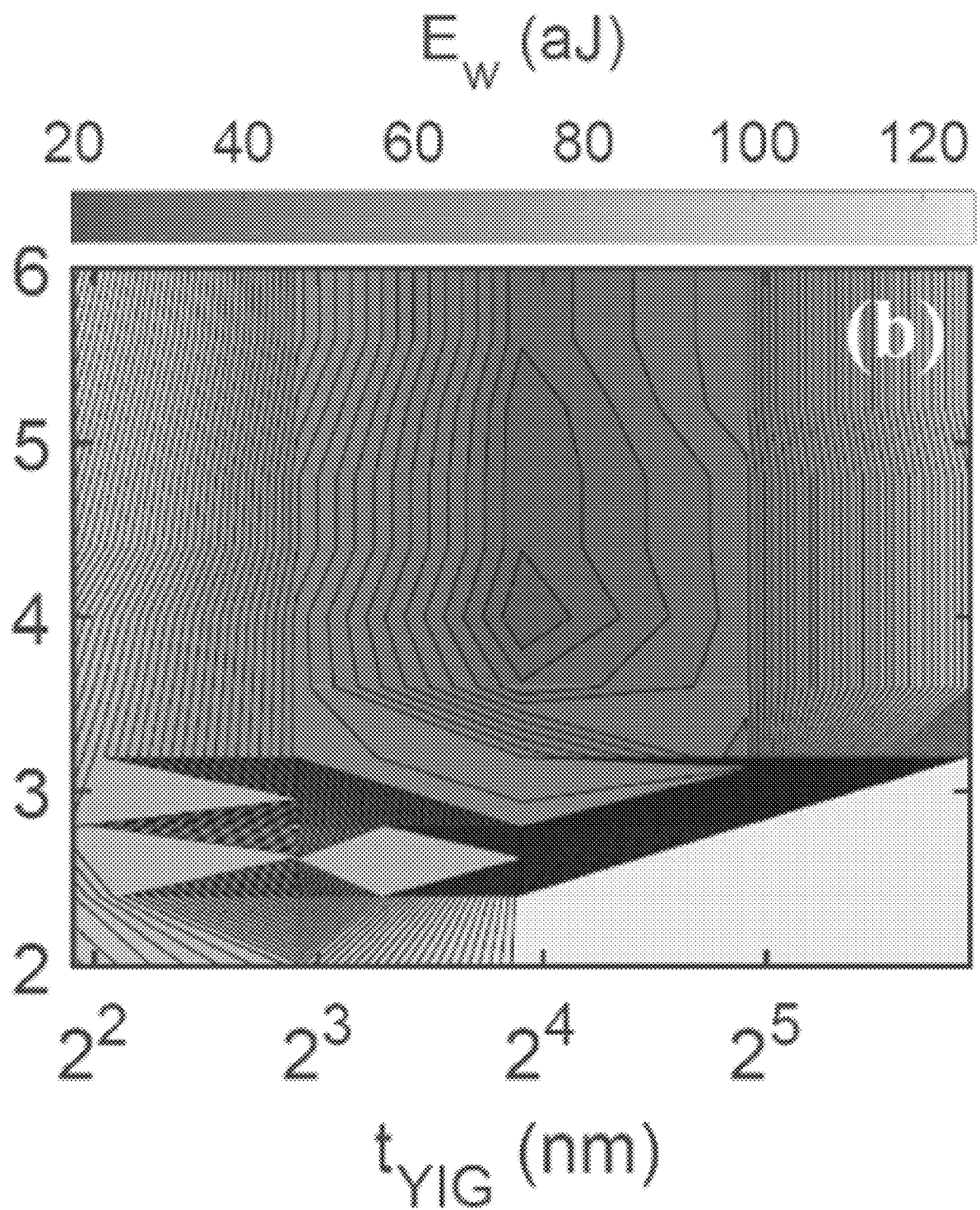
FIG. 4B is a chart illustrating relationships between write energy, exchange coupling, and magnetic insulator thickness for an example device having a diameter of 9.4 nm.
Figure 4C:
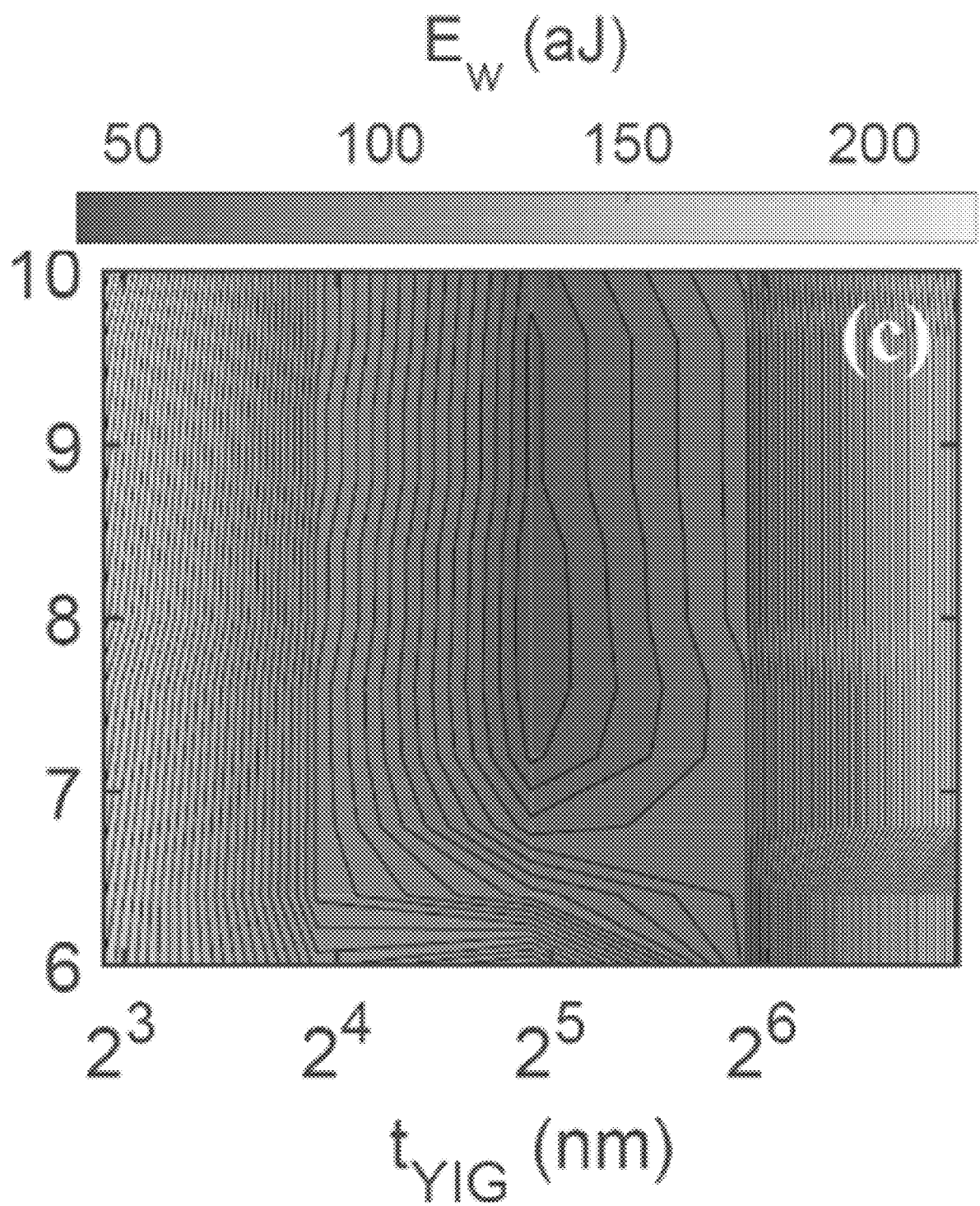
FIG. 4C is a chart illustrating relationships between write energy, exchange coupling, and magnetic insulator thickness for an example device having a diameter of 6.6 nm.

FIG. 4A is a chart illustrating relationships between write energy, exchange coupling, and magnetic insulator thickness for an example device having a diameter of 13.2 nm. FIG. 4B is a chart illustrating relationships between write energy, exchange coupling, and magnetic insulator thickness for an example device having a diameter of 9.4 nm. FIG. 4C is a chart illustrating relationships between write energy, exchange coupling, and magnetic insulator thickness for an example device having a diameter of 6.6 nm. The contours of FIGS. 4A, 4B, and 4C illustrate the $E_w$ scaling for structures with a diameter of 13.2 nm, 9.4 nm, and 6.6 nm. These diameters correspond to FePt thicknesses of 0.25 nm, 0.5 nm, and 1 nm, respectively. Thicknesses below 4 Å may not be practical for FePt, but the central argument may hold for other high $K_u$ materials such as FePd.

Example 2

The effect of changing the thickness of YIG (the ULD included YIG) and the exchange coupling were evaluated. A wide range of $t_{ULD}$ and $J_{ex}$ were explored for each device size—i.e., 1.9-32 nm and 0-34 erg/cm². A preferable point was obtained at $$\frac{t_{ULD} M_{s,ULD}}{t_{FM} M_{s,FM}} = 2 \text{ and } \frac{J_{ex}}{2t_{FM} K_{FM}} = 0.57$$

for each device size—i.e., the preferable $J_{ex}$ and $t_{YIG}$ scale proportionately with device size.

Figure 5A:
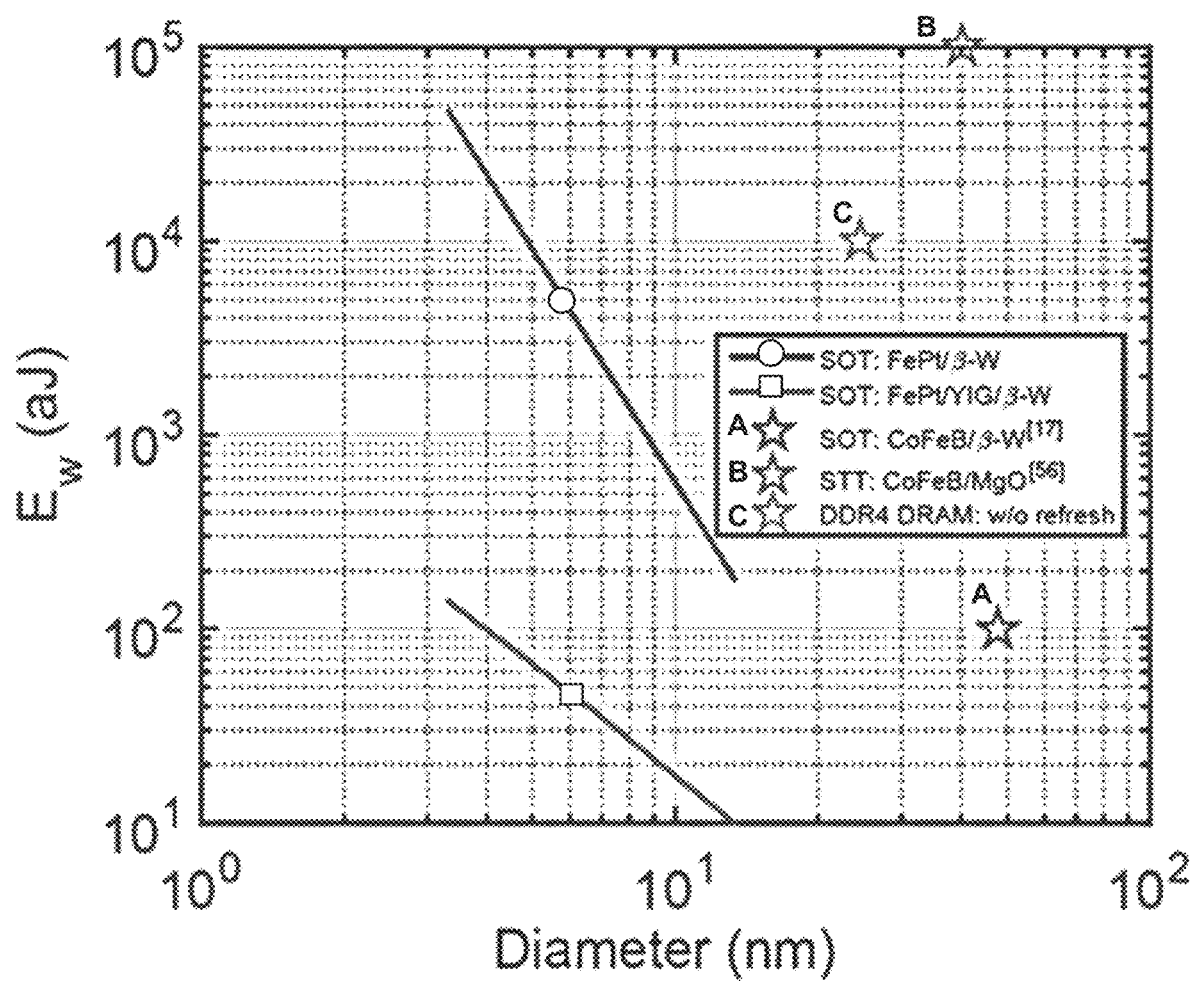
FIG. 5A is a chart illustrating relationships between write energy and diameters of example and comparative memory structures.
Figure 5B:
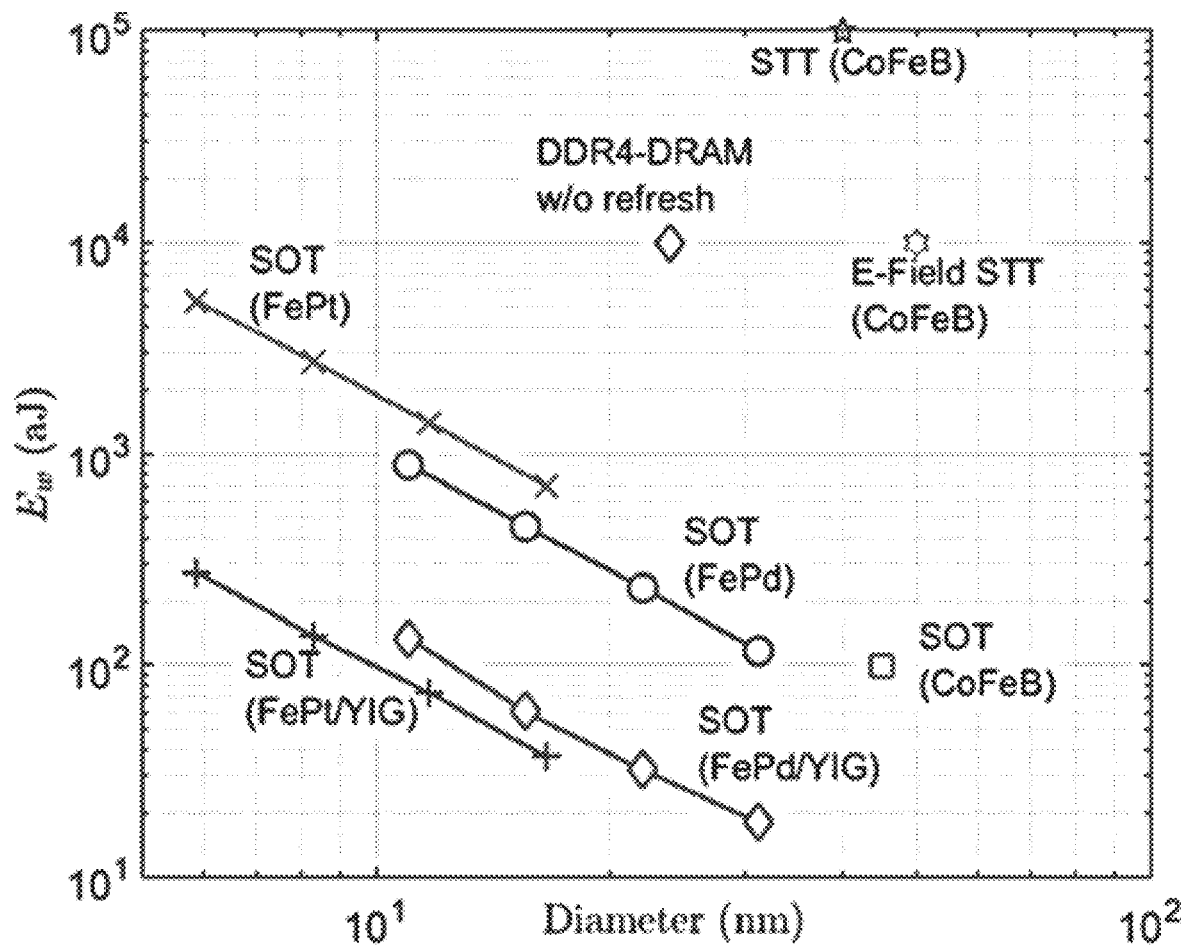
FIG. 5B is a chart illustrating relationships between write energy and diameters of example and comparative memory structures.

FIG. 5A is a chart illustrating relationships between write energy and diameters of example and comparative memory structures. FIG. 5B is a chart illustrating relationships between write energy and diameters of example and comparative memory structures. The $E_w$ of a single 60 kBT L1$_0$-FePt layer is calculated and included in FIG. 5A for comparison. At a diameter of 13.2 nm, the composite structure achieves $E_w$=10 aJ, while the single layer structure obtains $E_w$=182 aJ. For d=3.3 nm, the composite structure achieves $E_w$=138 aJ, while the single layer structure obtains $E_w$=46×10³ aJ. Therefore, the improvement ranges from 18-337×, suggesting that the composite free layer structure is the superior choice for ultra-high-density memory.

Figure 6A:
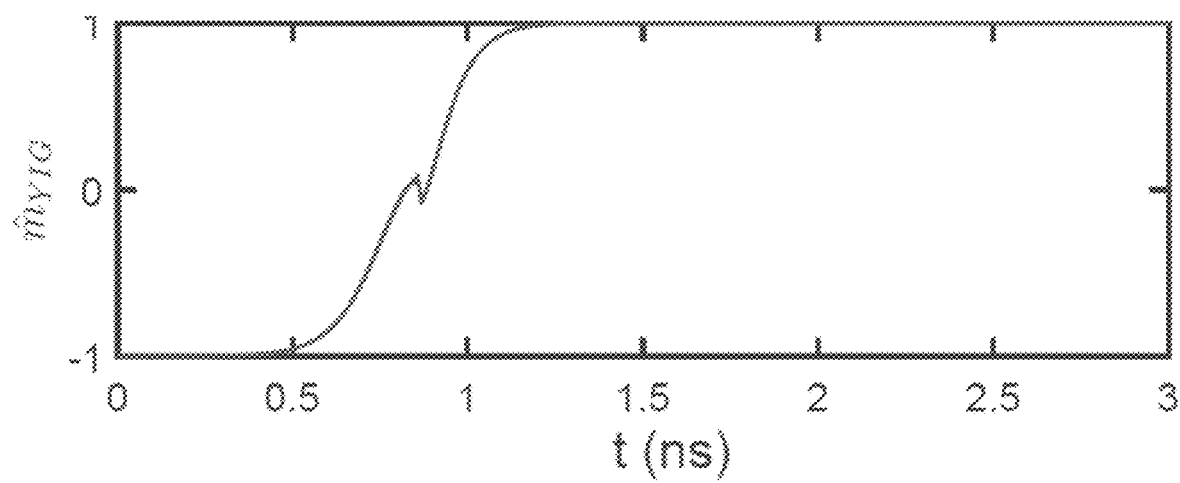
FIG. 6A is a chart illustrating magnetization reversal of an ultra-low damping magnetic insulator in an example antiferromagnetically coupled composite structure.
Figure 6B:
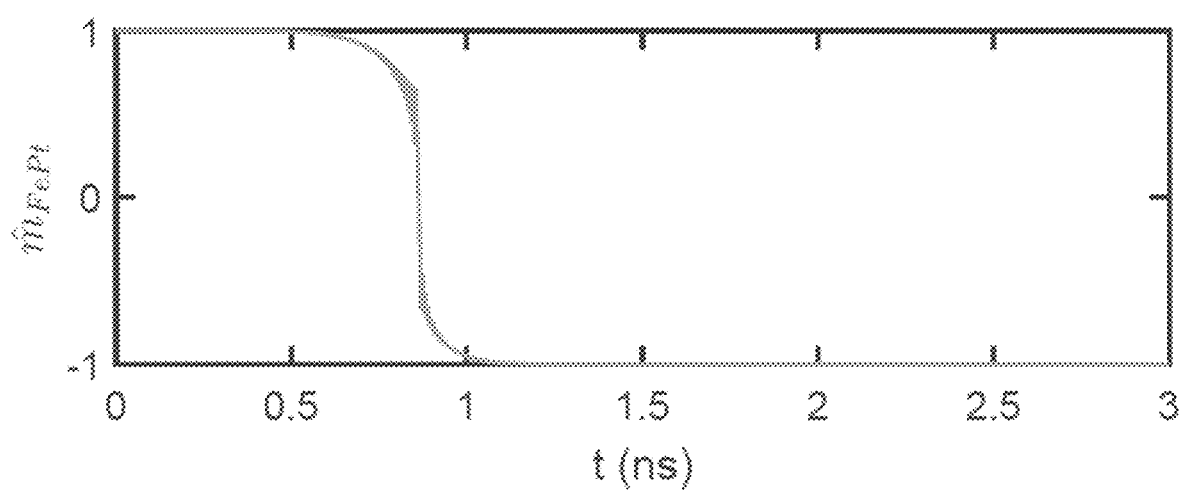
FIG. 6B is a chart illustrating magnetization reversal of a high-anisotropy ferromagnetic layer in the antiferromagnetically coupled composite structure of FIG. 6A.
Figure 7:
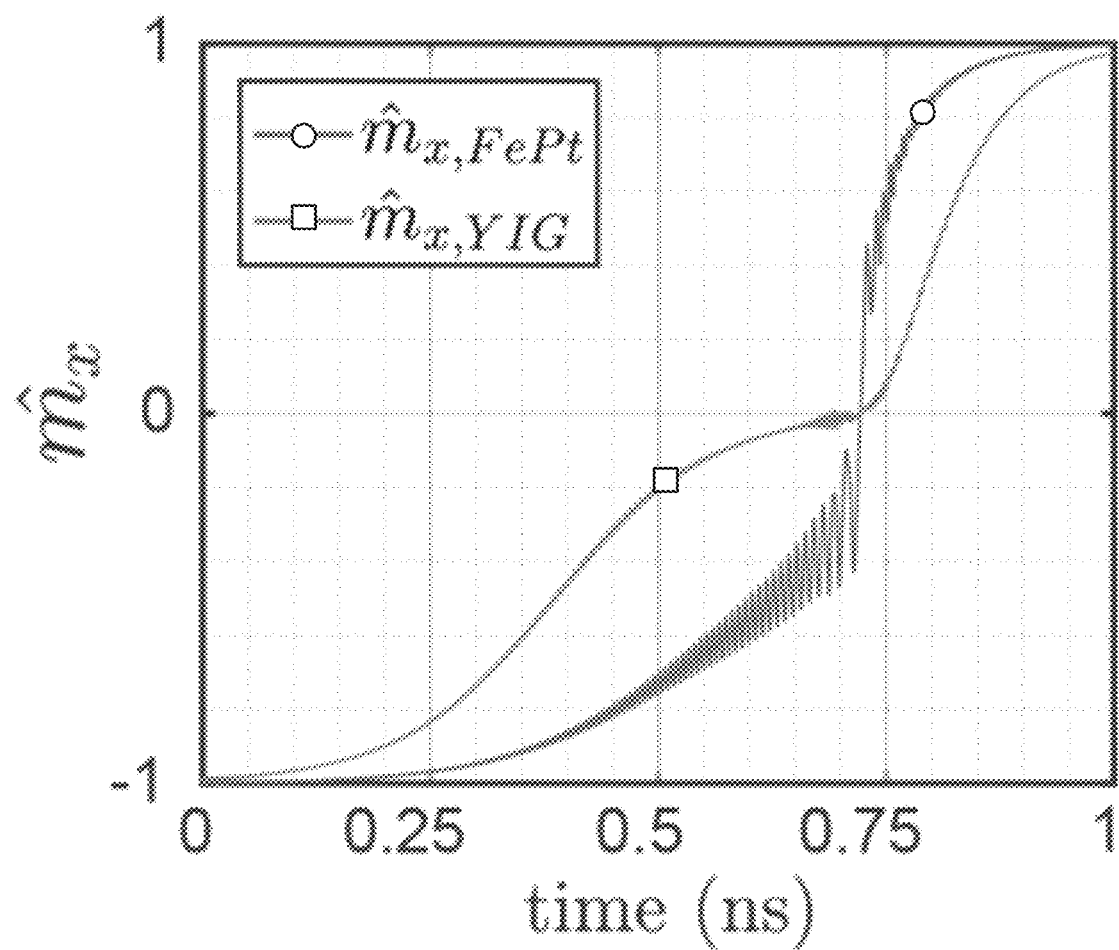
FIG. 7 is a chart illustrating magnetization switching of an ultra-low damping magnetic insulator and a high-anisotropy ferromagnetic layer in an example ferromagnetically coupled composite structure.

FIG. 6A is a chart illustrating magnetization reversal of an ultra-low damping magnetic insulator in an example antiferromagnetically coupled composite structure. FIG. 6B is a chart illustrating magnetization reversal of a high-anisotropy ferromagnetic layer in the antiferromagnetically coupled composite structure of FIG. 6A. FIG. 7 is a chart illustrating magnetization switching of an ultra-low damping magnetic insulator and a high-anisotropy ferromagnetic layer in an example ferromagnetically coupled composite structure. FIGS. 6A and 6B illustrate the magnetization reversal of both layers for an example structure with d=13.2 nm. The YIG layer experienced a SOT at 0 ns and began to switch, exerting its exchange field onto the FePt. At roughly 0.8 ns, this field was sufficient to switch the FePt magnetization. The comparative STT-MTJ can achieve an $E_w$ of approximately 10⁵ aJ, which is 10⁴× more write energy than the example composite cell (FIG. 5A). Moreover, these devices are only 40 kcBT with d=40 nm. A larger requisite device diameter results in larger write energy. Therefore, employment of high $K_u$ materials such as L1$_0$-FePt may be advantageous in SOT-RAM.

The state-of-the-art DDR4 DRAM has a standard cell area of 6 F², where F denotes the process—e.g., the state-of-the-art process is 10 nm. It operates at 1V with a cell capacitance of approximately 10 fF. Therefore, the well-known write energy of a DRAM cell is 10⁴ aJ (FIG. 5A)—a 10³ increase in $E_w$ compared to the composite structure. As seen in FIG. 5B, for a FePd/YIG composite free layer, $E_w$ could be reduced to 18 aJ (4300 $k_B$T) for 1 ns switching, a factor of 500× less than DDR4-DRAM (10 fJ).

By utilizing the exchange coupling between thermally stable L10-FePt and an ultra-low damped magnetic insulator such as YIG, a write energy of 10 aJ was achieved.

Example 3

Figure 8A:
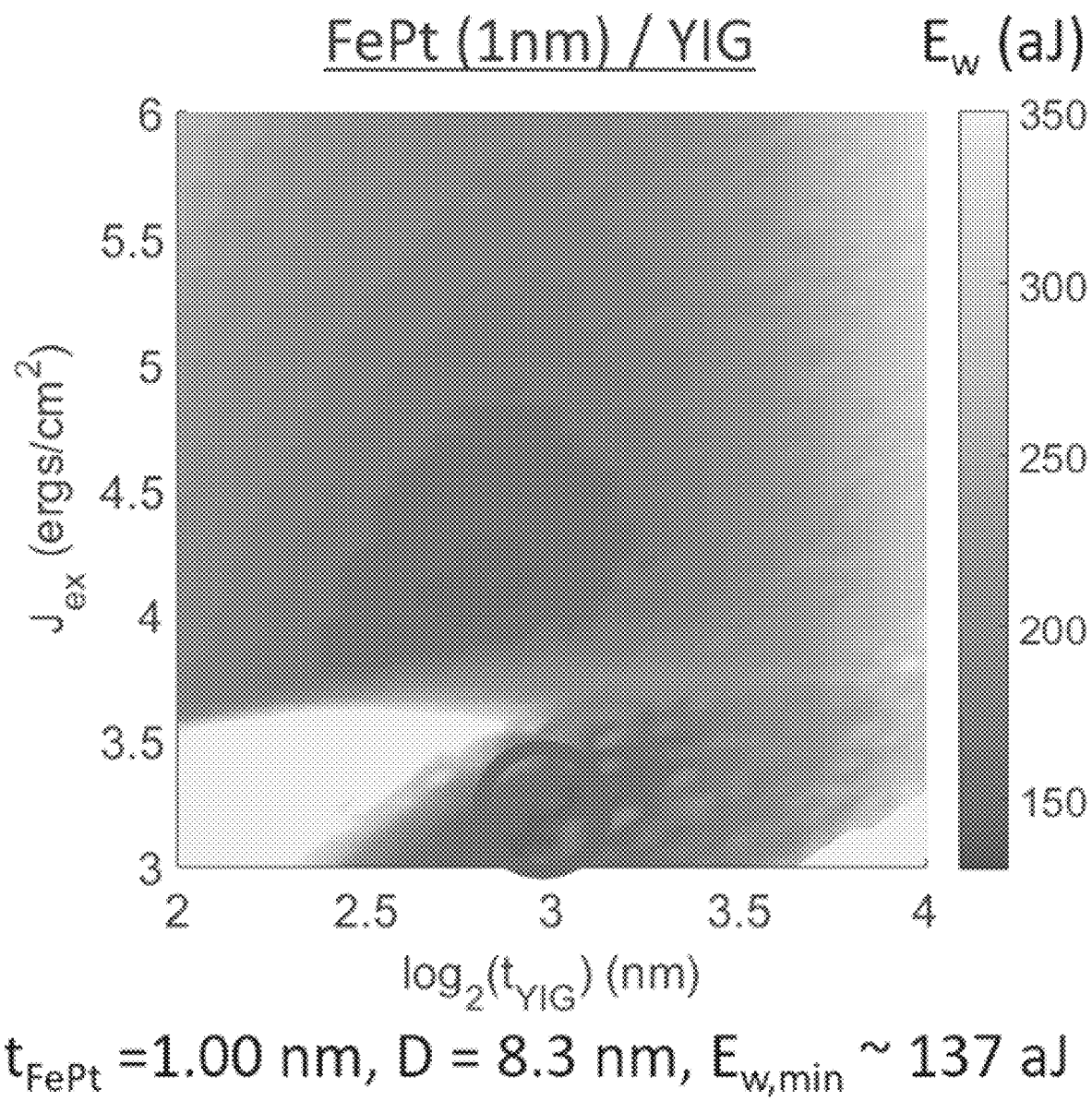
FIG. 8A is a chart illustrating relationships between write energy, exchange coupling, and magnetic insulator thickness for an example device having a diameter of 8.3 nm and including an FePt high-anisotropy ferromagnetic layer.

The effect of varying exchanging coupling, thickness of magnetic insulating layer, and thickness of high-anisotropy layer was evaluated by simulation. Δ was maintained at 60. FIG. 8A is a chart illustrating relationships between write energy, exchange coupling, and magnetic insulator thickness for an example device having a diameter of 8.3 nm and including an FePt high-anisotropy ferromagnetic layer. The thickness of the FePt layer was 1 nm, and $E_{w,min}$ was about 137 aJ.

Figure 8B:
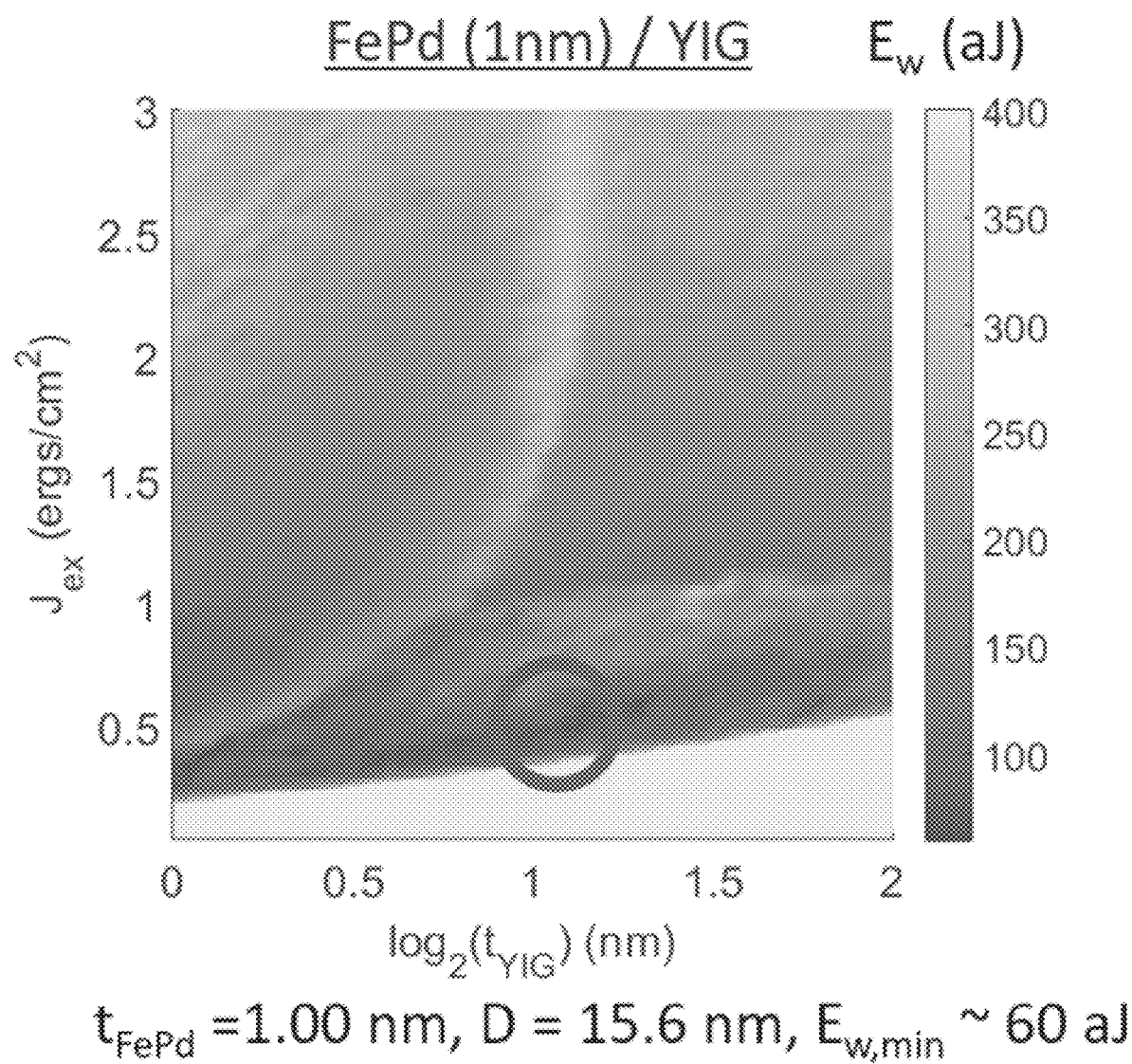
FIG. 8B is a chart illustrating relationships between write energy, exchange coupling, and magnetic insulator thickness for an example device having a diameter of 15.6 nm and including an FePd high-anisotropy ferromagnetic layer.

FIG. 8B is a chart illustrating relationships between write energy, exchange coupling, and magnetic insulator thickness for an example device having a diameter of 15.6 nm and including an FePd high-anisotropy ferromagnetic layer. The thickness of the FePt layer was 1 nm, and $E_{w,min}$ was about 60 aJ.

Example 4

Figure 9:
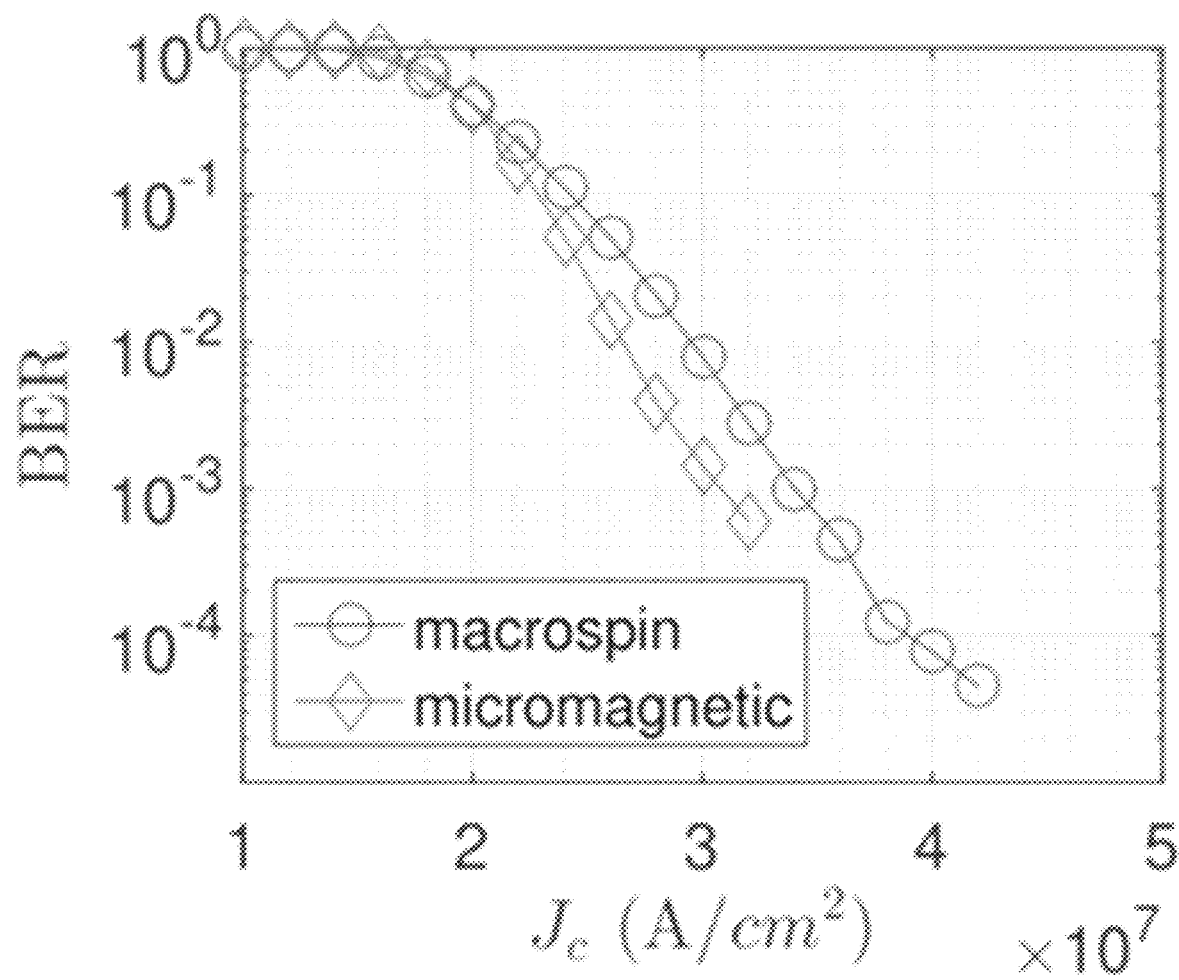
FIG. 9 is a chart illustrating bit error rates for macrospin and micromagnetic simulations for an example composite structure including an yttrium iron garnet (YIG) ultra-low damping magnetic insulator and an FePd high-anisotropy ferromagnetic layer.

Bit error rates were compared by micromagnetic and macrospin simulations. FIG. 9 is a chart illustrating bit error rates for macrospin and micromagnetic simulations for an example composite structure including a Yttrium iron garnet (YIG) ultra-low damping magnetic insulator and an FePd high-anisotropy ferromagnetic layer. The FePd layer had a 1 nm thickness, and the YIG layer had a thickness of 2.14 nm. The $J_{ex}$ was 0.5 ergs/cm², with diameter of 15.6 nm. The cell size for micromagnetic simulation was 2.6 nm×2.6 nm×1 nm. Micromagnetic simulation showed switching at a lower current than macrospin simulations.

Various examples have been described. These and other examples are within the scope of the following claims.

The invention claimed is:

1. An article comprising:
   a composite free layer, the composite free layer including:
      a high-anisotropy ferromagnetic layer,
      a non-magnetic transition metal layer adjacent to the high-anisotropy ferromagnetic layer, and
      an ultra-low damping magnetic insulator, wherein the non-magnetic transition metal layer is between the high-anisotropy ferromagnetic layer and the ultra-low damping magnetic insulator; and
   a conductive channel including a heavy metal region adjacent the composite free layer, wherein the ultra-low damping magnetic insulator is between the non-magnetic transition metal layer and the conductive channel.

2. The article of claim 1, wherein the high-anisotropy ferromagnetic layer comprises L1$_0$ FePt or L1$_0$ FePd.

3. The article of claim 1, wherein the high-anisotropy ferromagnetic layer has an anisotropy in a range from about 1×10⁶ ergs/cc to about 4×10⁷ ergs/cc.

4. The article of claim 1, wherein the high-anisotropy ferromagnetic layer has a thickness in a range from about 3 Angstroms (Å) to about 5 nanometers (nm).

5. The article of claim 1, wherein the non-magnetic transition metal layer has a thickness of less than about 15 Angstroms (Å).

6. The article of claim 1, wherein the non-magnetic transition metal layer comprises rhodium.

7. The article of claim 1, wherein the ultra-low damping magnetic insulator comprises an yttrium iron garnet (YIG).

8. The article of claim 1, wherein the heavy metal region of the conductive channel comprises β-tungsten.

9. The article of claim 1, further comprising a reference layer and a barrier layer adjacent the high-anisotropy ferromagnetic layer, wherein the barrier layer is between the reference layer and the high-anisotropy ferromagnetic layer, and wherein the high-anisotropy ferromagnetic layer is between the barrier layer and the non-magnetic transition metal layer.

10. The article of claim 9, wherein the barrier layer comprises MgO.

11. A memory device comprising:
a composite free layer, the composite free layer including:
a high-anisotropy ferromagnetic layer,
a non-magnetic transition metal layer adjacent to the high-anisotropy ferromagnetic layer, and
an ultra-low damping magnetic insulator, wherein the ultra-low damping magnetic insulator comprises an yttrium iron garnet (YIG) or barium ferrite, and wherein the non-magnetic transition metal layer is between the high-anisotropy ferromagnetic layer and the ultra-low damping magnetic insulator; and
a conductive channel including a heavy metal region adjacent the composite free layer, wherein the ultra-low damping magnetic insulator is between the non-magnetic transition metal layer and the conductive channel.

12. The memory device of claim 11, further comprising a reference layer and a barrier layer adjacent the high-anisotropy ferromagnetic layer, wherein the barrier layer is between the reference layer and the high-anisotropy ferromagnetic layer, and wherein the high-anisotropy ferromagnetic layer is between the barrier layer and the non-magnetic transition metal layer.

13. The memory device of claim 11, wherein the high-anisotropy ferromagnetic layer comprises $L1_0$ FePt or $L1_0$ FePd.

14. The memory device of claim 11, wherein the non-magnetic transition metal layer has a thickness of less than about 15 Angstroms (Å), and wherein the non-magnetic transition metal layer comprises rhodium.

15. The memory device of claim 11, wherein the memory device is a random access memory (RAM) device.

* * * * *